(12) United States Patent
Jomatsu et al.

(10) Patent No.: US 8,724,752 B2
(45) Date of Patent: May 13, 2014

(54) AMPLITUDE/ORTHOGONALITY ERROR COMPENSATOR

(71) Applicant: Panasonic Corporation, Osaka (JP)

(72) Inventors: Katsuhiro Jomatsu, Osaka (JP); Ippei Kanno, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/070,268

(22) Filed: Nov. 1, 2013

(65) Prior Publication Data

US 2014/0056386 A1   Feb. 27, 2014

Related U.S. Application Data

(63) Continuation of application No. PCT/JP2011/006994, filed on Dec. 14, 2011.

(30) Foreign Application Priority Data

May 10, 2011   (JP) .................................. 2011-105423

(51) Int. Cl.
  *H03D 1/04*   (2006.01)
(52) U.S. Cl.
  USPC ........................................................ 375/346
(58) Field of Classification Search
  USPC ......... 375/316, 322, 324, 346, 350; 455/63.1, 455/67.13, 114.2
  See application file for complete search history.

(56) References Cited

U.S. PATENT DOCUMENTS

| | | | |
|---|---|---|---|
| 7,456,683 B2 | 11/2008 | Takano et al. | |
| 2003/0007574 A1* | 1/2003 | Li et al. | 375/316 |
| 2003/0012305 A1* | 1/2003 | Auranen | 375/316 |
| 2004/0082300 A1* | 4/2004 | Scheck | 455/126 |
| 2005/0041754 A1* | 2/2005 | Wu et al. | 375/295 |
| 2005/0118963 A1* | 6/2005 | Chiu | 455/115.1 |
| 2005/0135521 A1* | 6/2005 | Nemer et al. | 375/350 |
| 2005/0213691 A1* | 9/2005 | Ozluturk et al. | 375/343 |

(Continued)

FOREIGN PATENT DOCUMENTS

| | | |
|---|---|---|
| JP | 2004-040678 A | 2/2004 |
| JP | 2008-263585 A | 10/2008 |
| JP | 2010-171512 A | 8/2010 |
| WO | 2006/132118 A1 | 12/2006 |

OTHER PUBLICATIONS

International Search Report issued in International Application No. PCT/JP2011/006994 with Date of mailing Mar. 13, 2012.

*Primary Examiner* — Khanh C Tran
(74) *Attorney, Agent, or Firm* — McDermott Will & Emery LLP

(57) ABSTRACT

An amplitude/orthogonality error compensator includes: an amplitude corrector configured to perform an amplitude correction on an in-phase component and a quadrature component of an input complex signal based on amplitude error information, and to output a complex signal obtained through the amplitude correction; an orthogonality corrector configured to perform an orthogonality correction on the complex signal, obtained through the amplitude correction, based on orthogonality error information, and to output a complex signal obtained through the orthogonality correction; a filter section configured to allow a predetermined frequency component included in the complex signal obtained through the orthogonality correction to pass through the filter section; an amplitude error detector configured to obtain the amplitude error information based on the complex signal that has passed through the filter section; and an orthogonality error detector configured to obtain the orthogonality error information of the complex signal.

4 Claims, 15 Drawing Sheets

(56) References Cited

U.S. PATENT DOCUMENTS

2006/0291549 A1* 12/2006 Seppinen et al. ............. 375/227
2008/0030264 A1    2/2008 Takano et al.
2009/0141788 A1*  6/2009 Ozluturk et al. .............. 375/235
2010/0104045 A1*  4/2010 Santraine et al. ............. 375/324
2012/0236975 A1*  9/2012 Yamagishi .................... 375/346

* cited by examiner

|IL| > |QL|

|IL| < |QL|

AMPLITUDE/ORTHOGONALITY ERROR COMPENSATOR

CROSS-REFERENCE TO RELATED APPLICATION

This is a continuation of International Application No. PCT/JP2011/006994 filed on Dec. 14, 2011, which claims priority to Japanese Patent Application No. 2011-105423 filed on May 10, 2011. The entire disclosures of these applications are incorporated by reference herein.

BACKGROUND

The present disclosure relates to, for example, demodulators for use in analog or digital radio communication. The present disclosure relates particularly to a system for determining and correcting an amplitude error or an orthogonality error between an in-phase component and a quadrature component of a complex signal after quadrature detection.

In order to receive and demodulate signals modulated by various analog or digital modulation techniques, quadrature detection is typically performed on received signals with a quadrature detector constituted by an analog circuit, and the detection result is obtained as a complex signal (an IQ signal).

An in-phase component and a quadrature component of a complex signal output from a quadrature detector are ideally orthogonal to each other and have the same average amplitude (see FIG. 2A). However, since a quadrature detector constituted by an analog circuit is affected by, for example, characteristic variations among analog devices and temperature characteristics and voltage characteristics of the analog devices, an amplitude error or an orthogonality error occurs between the in-phase component and the quadrature component of the complex signal (see, for example, FIG. 2B). Thus, in signal detection using a complex signal from such a quadrature detector without any additional processing, an image interference occurs to degrade reception performance of a receiver.

To prevent this interference, International Patent Publication No. WO2006/132118 proposes an amplitude error compensator and an orthogonality error compensator that accurately and stably correct an amplitude error and an orthogonality error even with an uneven distribution of constellation points of an input complex signal.

SUMMARY

In the orthogonality error compensator circuit proposed in International Patent Publication No. WO2006/132118, the uneven distribution of constellation points of an input complex signal affected by, for example, characteristic variations among analog devices and temperature characteristics and voltage characteristics of the analog devices can be made uniform taking an average in a complex plane. The amplitude error and the orthogonality error between the in-phase component and the quadrature component of the complex signal vary depending on the frequency of the complex signal. Accordingly, the presence of a plurality of signals having different frequencies in an input signal disadvantageously reduces accuracy in an amplitude error correction and an orthogonality error correction.

It is therefore an object of the present disclosure to perform a more accurate amplitude correction and a more accurate orthogonality correction even in the presence of a plurality of signals having different frequencies in an input signal.

An example amplitude/orthogonality error compensator according to an embodiment of the present disclosure includes: an amplitude corrector configured to perform an amplitude correction on an in-phase component and a quadrature component of an input complex signal based on amplitude error information, and to output a complex signal obtained through the amplitude correction; an orthogonality corrector configured to perform an orthogonality correction on the complex signal, obtained through the amplitude correction, based on orthogonality error information, and to output a complex signal obtained through the orthogonality correction; a filter section configured to allow a predetermined frequency component included in the complex signal obtained through the orthogonality correction to pass through the filter section; an amplitude error detector configured to determine the amplitude error information based on an in-phase component and a quadrature component of the complex signal that has passed through the filter section; and an orthogonality error detector configured to determine the orthogonality error information indicating an orthogonality error between the in-phase component and the quadrature component of the complex signal that has passed through the filter section.

According to the present disclosure, amplitude error information and orthogonality error information are obtained based on an in-phase component and a quadrature component of a complex signal that has passed through a filter section. Thus, even in a case where an input signal includes a plurality of signals having different frequencies, an amplitude correction and an orthogonality correction can be performed more accurately.

DETAILED DESCRIPTION

Figure 1:
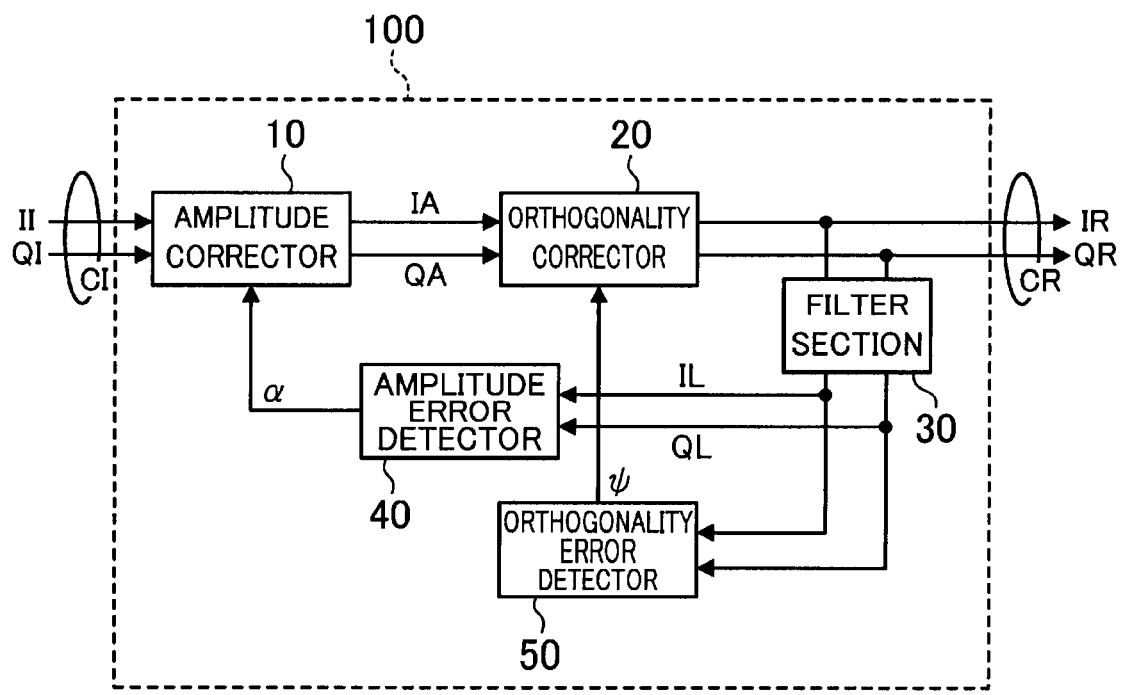
FIG. 1 is a block diagram illustrating an example configuration of an amplitude/orthogonality error compensator according to an embodiment of the present disclosure.

An embodiment of the present disclosure will be described with reference to the drawings. In the drawings, like reference characters are used to designate identical or equivalent elements.

FIG. 1 is a block diagram illustrating an example configuration of an amplitude/orthogonality error compensator according to an embodiment of the present disclosure. An amplitude/orthogonality error compensator 100 illustrated in FIG. 1 includes an amplitude corrector 10, an orthogonality corrector 20, a filter section 30, an amplitude error detector 40, and an orthogonality error detector 50. The amplitude corrector 10 receives a complex signal CI that was received at an antenna and then subjected to quadrature detection. The complex signal CI includes an in-phase component II and a quadrature component QI.

Figure 2A:
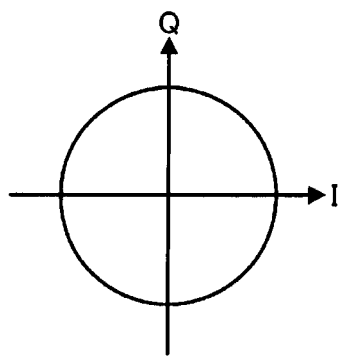
FIG. 2A illustrates an example locus of a vector having an ideal in-phase component II and an ideal quadrature component QI input to an amplitude corrector illustrated in FIG. 1.
Figure 2B:
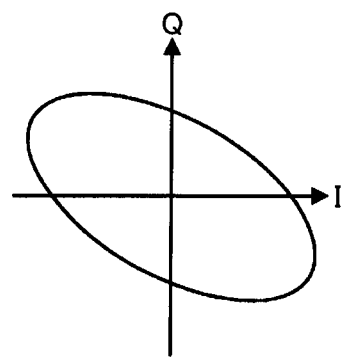
FIG. 2B illustrates an example locus of a vector having an in-phase component II and a quadrature component QI between which an amplitude error and an orthogonality error have occurred.

FIG. 2A illustrates an example locus of a vector having an ideal in-phase component II and an ideal quadrature component QI input to the amplitude corrector 10 of FIG. 1. FIG. 2B illustrates an example locus of a vector having an in-phase component II and a quadrature component QI between which an amplitude error and an orthogonality error have occurred. Ideally, the locus of a vector is a complete circle as illustrated in FIG. 2A. With an amplitude error, the locus of a vector is an ellipse, and with an orthogonality error as well as the amplitude error, the major axis of the ellipse coincides with none of the I axis and the Q axis, as illustrated in FIG. 2B.

Figure 3A:
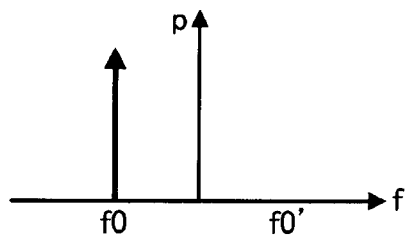
FIG. 3A shows a spectrum of the complex signal CI in the case of FIG. 2A.
Figure 3B:
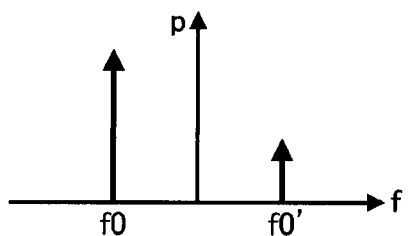
FIG. 3B shows a spectrum of a complex signal CI in the case of FIG. 2B.

FIG. 3A shows a spectrum of the complex signal CI in the case of FIG. 2A. FIG. 3B shows a spectrum of the complex signal CI in the case of FIG. 2B. In FIG. 2A where none of an amplitude error and an orthogonality error have occurred, only the spectrum of a frequency f0 is present with no image interference signal. In FIG. 2B where an amplitude error and an orthogonality error have occurred, an image interference signal with a frequency f0' is generated.

Figure 4:
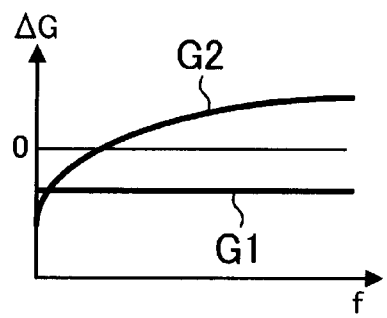
FIG. 4 is a graph showing an example frequency characteristic of an amplitude error $\Delta G$.
Figure 5:
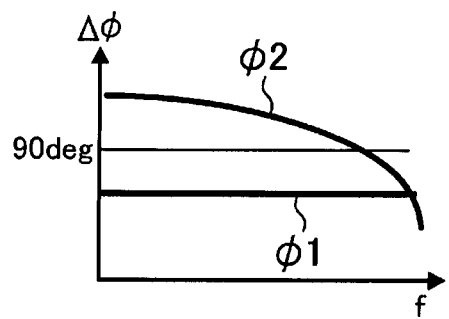
FIG. 5 is a graph showing an example frequency characteristic of an orthogonality error $\Delta \phi$.

FIG. 4 is a graph showing example frequency characteristic of an amplitude error $\Delta G$. In FIG. 4, a line G1 represents a case where an amplitude error $\Delta G$ between an in-phase component II and a quadrature component QI is constant irrespective of the frequency f, and a curve G2 represents a case where the amplitude error $\Delta G$ increases with increase in the frequency f. FIG. 5 is a graph showing example frequency characteristic of an orthogonality error $\Delta \phi$. In FIG. 5, a line $\phi 1$ represents a case where an orthogonality error $\Delta \phi$ between an in-phase component II and a quadrature component QI is constant irrespective of the frequency f, and a curve $\phi 2$ represents a case where the orthogonality error $\Delta \phi$ decreases with increase in the frequency f. The following description is directed to a case where the complex signal CI has an amplitude error represented by the curve G2 of FIG. 4 and an orthogonality error represented by the curve $\phi 2$ of FIG. 5.

The amplitude corrector 10 performs an amplitude correction on an in-phase component II and a quadrature component QI such that the amplitude difference between the in-phase component II and the quadrature component QI is reduced, based on an in-phase amplitude error factor $\alpha$ that is amplitude error information from the amplitude error detector 40. Then, the amplitude corrector 10 outputs an in-phase component IA and a quadrature component QA obtained by the amplitude correction.

The orthogonality corrector 20 performs an orthogonality correction on the in-phase component IA and the quadrature component QA such that the in-phase component IA and the quadrature component QA are orthogonal to each other, based on orthogonality error information ψ from the orthogonality error detector 50. Then, the orthogonality corrector 20 outputs a complex signal CR (having an in-phase component IR and a quadrature component QR) obtained by the orthogonality correction. The filter section 30 allows predetermined frequency components of the in-phase component IR and the quadrature component QR to pass therethrough and outputs the predetermined frequency components as an in-phase component IL and a quadrature component QL.

The amplitude error detector 40 determines an in-phase amplitude error factor α based on the in-phase component IL and the quadrature component QL, and outputs the determined in-phase amplitude error factor α to the amplitude corrector 10. That is, the amplitude error detector 40 and the amplitude corrector 10 perform a feedback correction of the amplitude error. The in-phase amplitude error factor α is a value to be used for a multiplication of the in-phase component II for the amplitude error correction. The orthogonality error detector 50 determines orthogonality error information ψ between the in-phase component IL and the quadrature component QL, and outputs the determined orthogonality error information ψ to the orthogonality corrector 20. That is, the orthogonality error detector 50 and the orthogonality corrector 20 perform a feedback correction of the orthogonality error.

Figure 6:
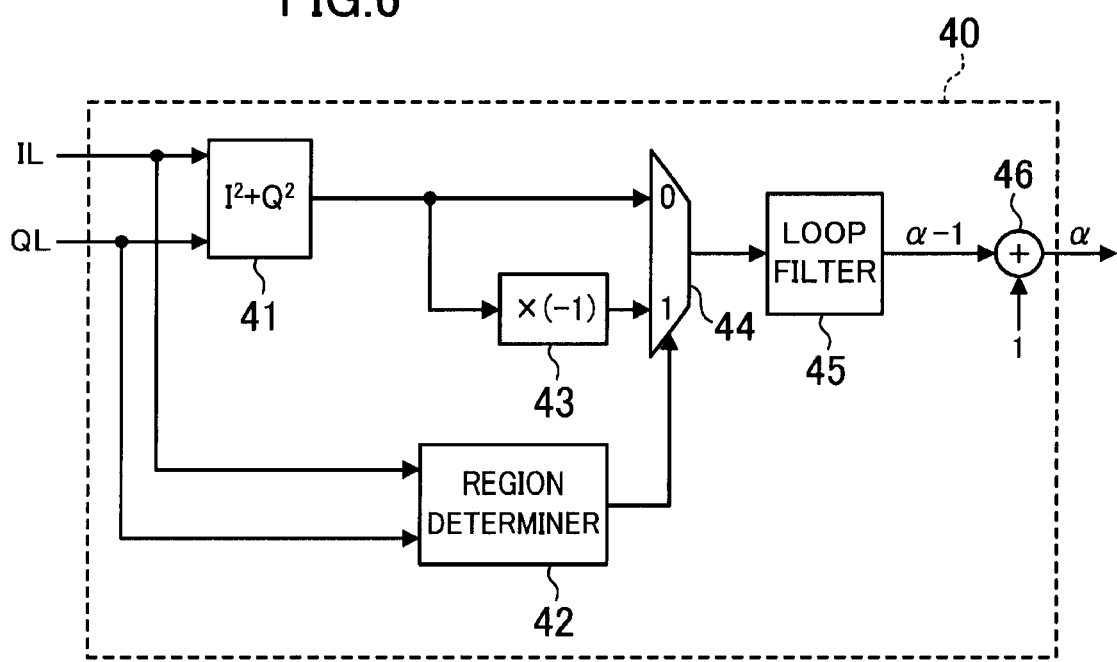
FIG. 6 is a block diagram illustrating an example configuration of an amplitude error detector illustrated in FIG. 1.

FIG. 6 is a block diagram illustrating an example configuration of the amplitude error detector 40 illustrated in FIG. 1. The amplitude error detector 40 includes a power value calculator 41, a region determiner 42, a sign inverter 43, a selector 44, a loop filter 45, and an adder 46. The power value calculator 41 calculates a sum of a square of the in-phase component IL and a square of the quadrature component QL, and outputs the sum as a power value. The sign inverter 43 inverts the sign of the received power value and outputs the resulting power value.

Figure 7:
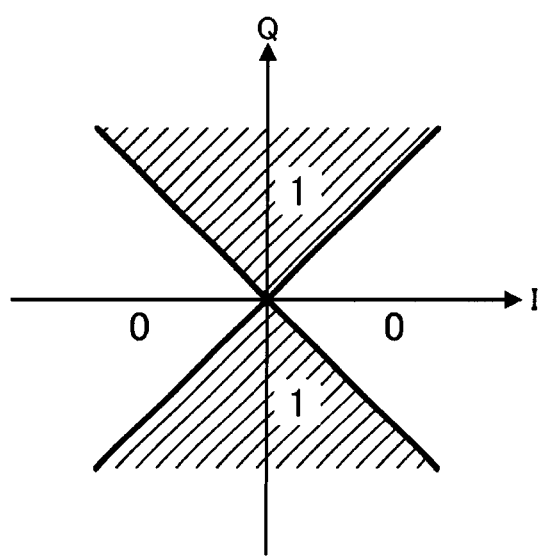
FIG. 7 is an illustration of processing of a region determiner illustrated in FIG. 6.

FIG. 7 is an illustration of processing of the region determiner 42 illustrated in FIG. 6. In a case where the relationship between the in-phase component IL and the quadrature component QL falls in regions indicated by "1" in FIG. 7, i.e., either where QL≥IL and QL≥−IL or where QL≤IL and QL≤−IL, for example, the region determiner 42 outputs "1". On the other hand, in a case where the relationship between the in-phase component IL and the quadrature component QL falls in regions indicated by "0" in FIG. 7, i.e., either where QL<IL and QL>−IL or where QL>IL and QL<−IL, the region determiner 42 outputs "0".

The selector 44 selects and outputs an output of the sign inverter 43 while the region determiner 42 outputs "1", and selects and outputs the power value obtained by the power value calculator 41 while the region determiner 42 outputs "0". The loop filter 45 smooths and outputs the output of the selector 44. The adder 46 adds 1 to the output of the loop filter 45.

Figure 8A:
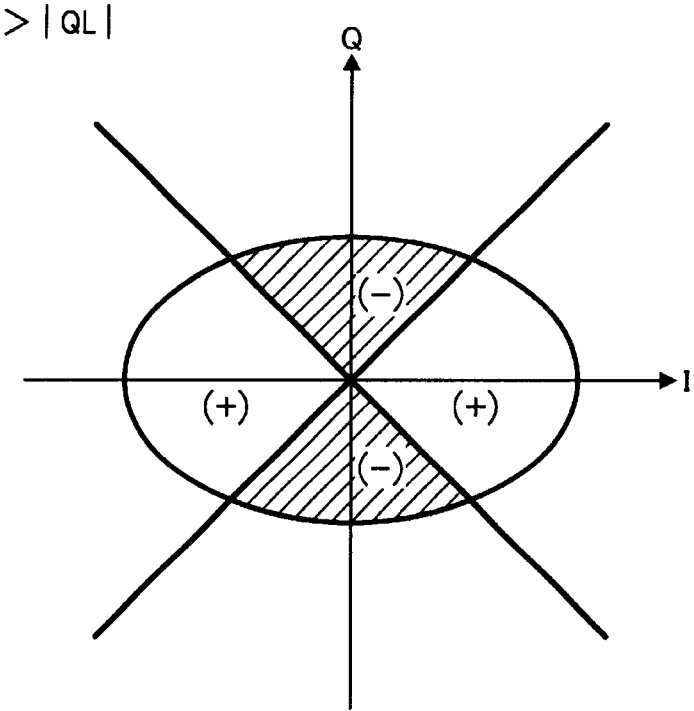
FIG. 8A illustrates an example locus of a vector having an in-phase component IL and a quadrature component QL in a case where the amplitude of the in-phase component IL is larger than that of the quadrature component QL.
Figure 8B:
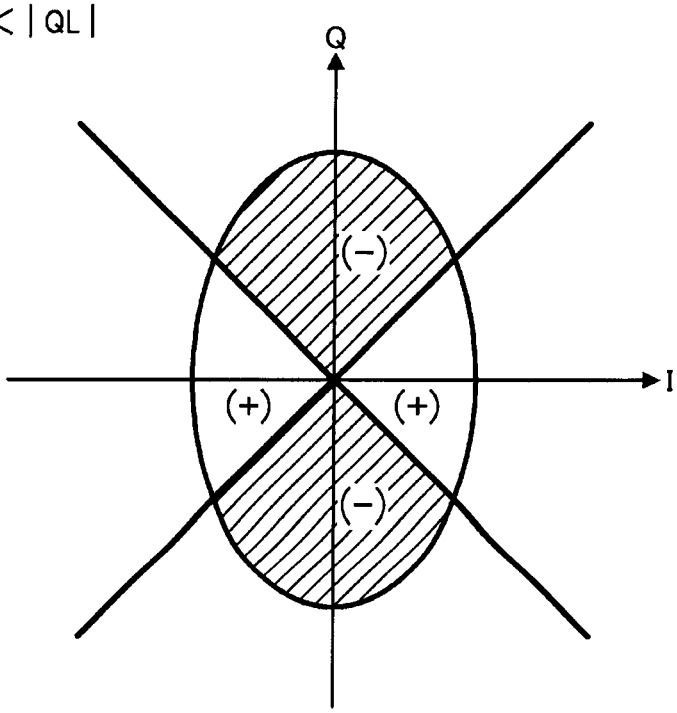
FIG. 8B illustrates an example locus of a vector having an in-phase component IL and a quadrature component QL in a case where the amplitude of the in-phase component IL is smaller than that of the quadrature component QL.

FIG. 8A illustrates a locus of a vector having an in-phase component IL and a quadrature component QL in a case where the amplitude of the in-phase component IL is larger than that of the quadrature component QL. FIG. 8B illustrates a locus of a vector having an in-phase component IL and a quadrature component QL in a case where the amplitude of the in-phase component IL is smaller than that of the quadrature component QL. Through the foregoing processing, the amplitude error detector 40 outputs an in-phase amplitude error factor α corresponding to the sum of power values obtained in consideration of signs in FIGS. 8A and 8B, with respect to constellation points on ellipses as illustrated in FIGS. 8A and 8B. The sum of the power values is a value obtained by addition of power values at the constellation points in a case where the constellation points are located in a (+) region in FIG. 8A or 8B, and is a value obtained by subtraction of power values at the constellation points in a case where the constellation points are located in a (−) region. Specifically, the sum of power values is obtained through selection by the selector 44 and smoothing by the loop filter 45. The factor α satisfies the relationship of α>1 in the case of FIG. 8A, and satisfies the relationship of α<1 in the case of FIG. 8B.

Figure 9:
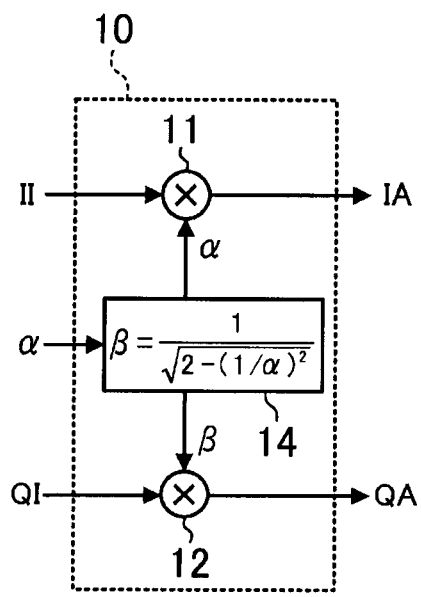
FIG. 9 is a block diagram illustrating an example configuration of an amplitude corrector illustrated in FIG. 1.

FIG. 9 is a block diagram illustrating an example configuration of the amplitude corrector 10 illustrated in FIG. 1. The amplitude corrector 10 includes multipliers 11 and 12 and a quadrature amplitude error factor calculator 14. The quadrature amplitude error factor calculator 14 calculates a quadrature amplitude error factor β based on the in-phase amplitude error factor α from the amplitude error detector 40. The quadrature amplitude error factor β is a value to be used for a multiplication of the quadrature component QI for an amplitude error correction.

The multiplier 11 multiplies the in-phase component II by the in-phase amplitude error factor α, and outputs the product as an in-phase component IA. The multiplier 12 multiplies the quadrature component QI by the quadrature amplitude error factor β, and outputs the product as a quadrature component QA. Here, the quadrature amplitude error factor calculator 14 calculates the quadrature amplitude error factor β such that the power value obtained from the in-phase component II and the quadrature component QI input to the amplitude corrector 10 is equal to that obtained from the in-phase component IA and the quadrature component QA output from the amplitude corrector 10.

Figure 10:
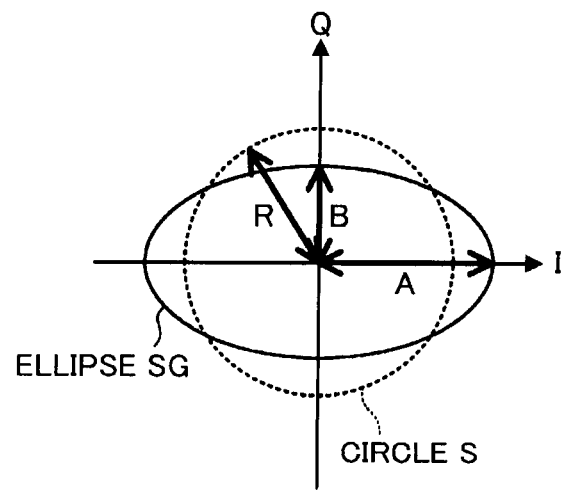
FIG. 10 illustrates an example locus of a vector having an in-phase component and a quadrature component between which an amplitude error has occurred.

FIG. 10 illustrates an example locus of a vector having an in-phase component and a quadrature component between which an amplitude error has occurred. Calculation of the quadrature amplitude error factor β will now be specifically described.

In a case where an amplitude error has occurred between the in-phase component I and the quadrature component Q, the locus of a vector having these components is represented by an ellipse SG in FIG. 10 in average. Suppose the in-phase component IA and the quadrature component QA after the amplitude correction have the same amplitude, the locus of the vector having these components is represented by a complete circle S in FIG. 10 in average. In FIG. 10, A is the major radius of the ellipse SG, B is the minor radius of the ellipse SG, and R is the radius of the complete circle S.

First, the complete circle S is represented in a polar coordinate system where I=R cos θ and Q=R sin θ. Suppose the probability distribution of the average amplitude of a complex signal having an in-phase component IA and a quadrature component QA is uniform in a range where θ is from 0 to 2π, the average power value of this complex signal is obtained by:

$$\int [0 \to 2\pi] R^2 (\cos^2 \theta + \sin^2 \theta) d\theta / 2\pi = R^2 \qquad (1)$$

where $\int [0 \to 2\pi] d\theta$ is an integral from θ=0 to θ=2π.

Then, the ellipse SG is represented in a polar coordinate system where I=A cos θ and Q=B sin θ. Suppose the probability distribution of the average amplitude of a complex signal having an in-phase component I and a quadrature component Q is uniform in a range where θ is from 0 to 2π, the average power value of this complex signal is obtained by:

$$\int [0 \to 2\pi](A^2 \cos^2 \theta + B^2 \sin^2 \theta) d\theta / 2\pi = (A^2 + B^2)/2 \quad (2)$$

The addition of a condition for making power values uniform between before and after the correction modifies Equations (1) and (2) to:

$$A^2 + B^2 = 2R^2 \quad (3)$$

The amplitude corrector 10 multiplies the in-phase component I by the in-phase amplitude error factor α, and multiplies the quadrature component Q by the quadrature amplitude error factor β, thereby performing an amplitude correction. Since signals before and after the correction have the same average amplitude, an average amplitudes A and B before the correction and an average amplitude R after the correction have a relationship obtained by:

$$\alpha A = R \quad (4)$$

$$\beta B = R \quad (5)$$

Substituting Equations (4) and (5) in Equation (3) and representing β by using α yield:

$$\beta = 1/\sqrt{\{2 - (1/\alpha)^2\}} \quad (6)$$

By using the relationship of Equation (6), the quadrature amplitude error factor calculator 14 calculates the quadrature amplitude error factor β from the in-phase amplitude error factor α. The quadrature amplitude error factor calculator 14 can be implemented by, for example, a read-only memory (ROM) that stores a look-up table representing the relationship of Equation (6).

As described above, based on the identicalness of the average power values before and after the correction and the in-phase amplitude error factor α that is a scalar quantity, the amplitude corrector 10 performs a gain adjustment, i.e., an amplitude correction, of each of the in-phase component II and the quadrature component QI.

In the foregoing description, the quadrature amplitude error factor β is obtained from the in-phase amplitude error factor α. In an alternative example, the quadrature amplitude error factor β is obtained by the amplitude error detector and the in-phase amplitude error factor α is obtained by using Equation (6).

Figure 11:
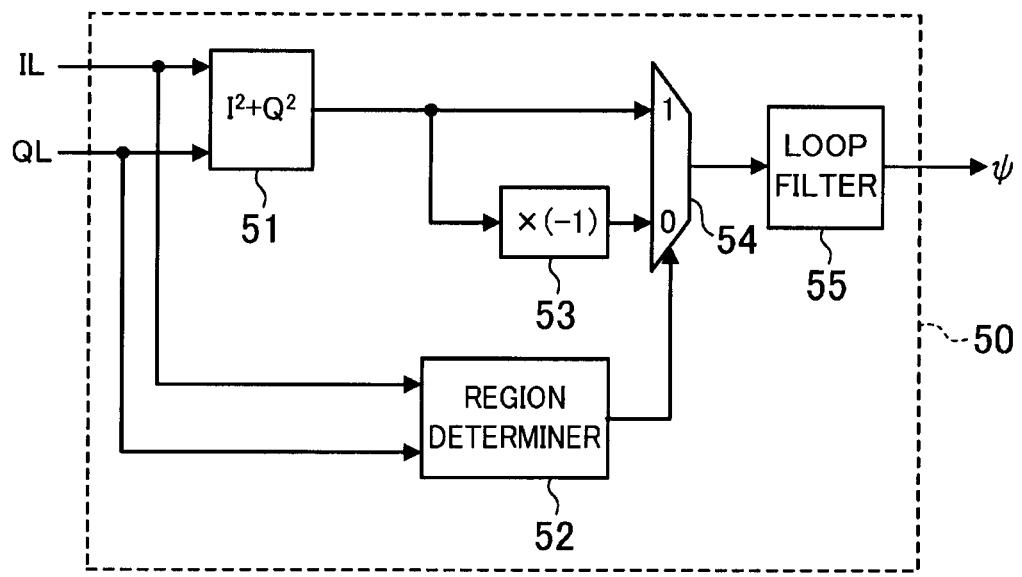
FIG. 11 is a block diagram illustrating an example configuration of an orthogonality error detector illustrated in FIG. 1.

FIG. 11 is a block diagram illustrating an example configuration of the orthogonality error detector 50 illustrated in FIG. 1. The orthogonality error detector 50 includes a power value calculator 51, a region determiner 52, a sign inverter 53, a selector 54, and a loop filter 55. The power value calculator 51 calculates a sum of a square of the in-phase component IL and a square of the quadrature component QL, and outputs the sum as a power value. The sign inverter 53 inverts the sign of the obtained sum and outputs the resulting sum.

Figure 12:
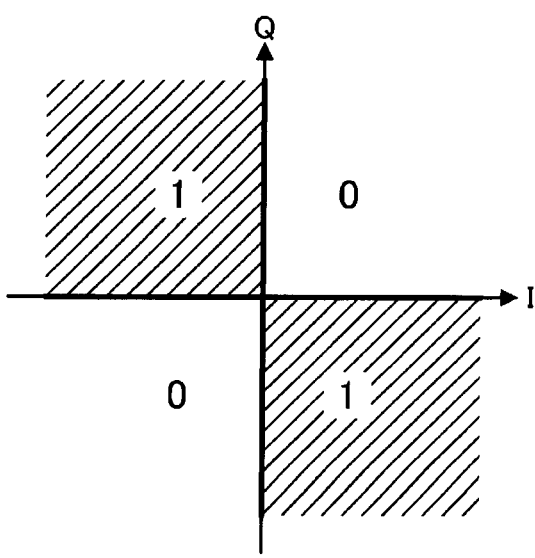
FIG. 12 is an illustration of processing of a region determiner illustrated in FIG. 11.

FIG. 12 is an illustration of processing of the region determiner 52 illustrated in FIG. 11. In a case where the relationship between the in-phase component IL and the quadrature component QL falls in regions indicated by "1" in FIG. 12, i.e., either where QL≥0 and IL≤0 or where QL≤0 and IL≥0, for example, the region determiner 52 outputs "1". On the other hand, in a case where the relationship between the in-phase component IL and the quadrature component QL falls in regions indicated by "0" in FIG. 12, i.e., either where QL>0 and IL>0 or where QL<0 and IL<0, the region determiner 52 outputs "0".

The selector 54 selects and outputs an output of the sign inverter 53 while the region determiner 52 outputs "0", and selects and outputs the power value obtained by the power value calculator 51 while the region determiner 52 outputs "1". The loop filter 55 smooths and outputs the output of the selector 54.

Figure 13A:
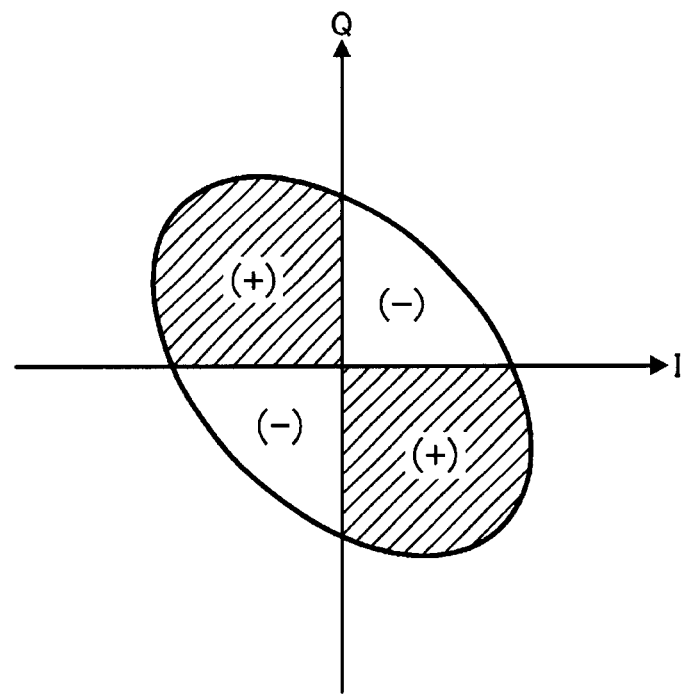
FIG. 13A illustrates an example locus of a vector having an in-phase component IL and a quadrature component QL in a case where the phase difference between the in-phase component IL and the quadrature component QL is larger than 90°.
Figure 13B:
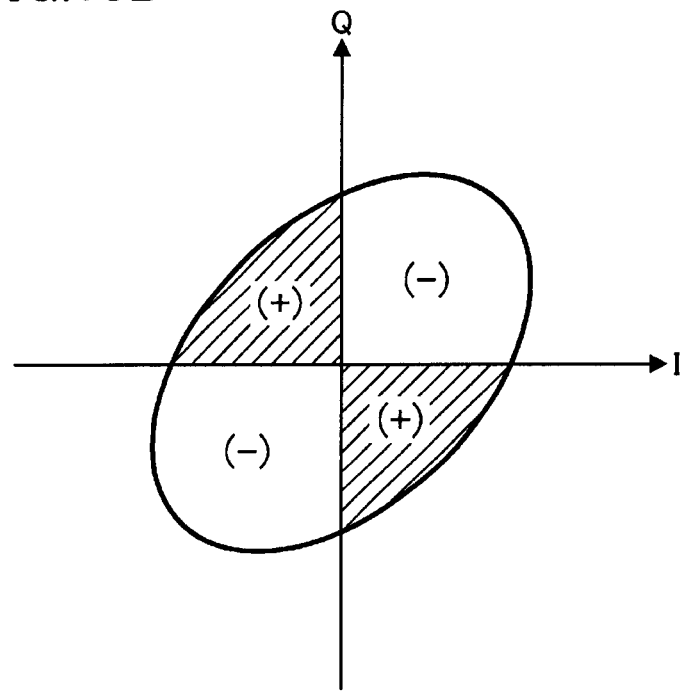
FIG. 13B illustrates an example locus of a vector having an in-phase component IL and a quadrature component QL in a case where the phase difference between the in-phase component IL and the quadrature component QL is smaller than 90°.

FIG. 13A illustrates a locus of a vector having an in-phase component IL and a quadrature component QL in a case where the phase difference between the in-phase component IL and the quadrature component QL is larger than 90°. FIG. 13B illustrates a locus of a vector having an in-phase component IL and a quadrature component QL in a case where the phase difference between the in-phase component IL and the quadrature component QL is smaller than 90°. Through the foregoing processing, the region determiner 52 outputs orthogonality error information ψ corresponding to the sum of power values obtained in consideration of the sign, with respect to constellation points on an ellipse in FIG. 13A or 13B. The sum of the power values is obtained by addition of power values at the constellation points in a case where the constellation points are located in a (+) region in FIG. 13A or 13B, and is a value obtained by subtraction of power values at constellation points in a case where the constellation points are located in a (−) region. Specifically, the sum of power values is obtained through selection by the selector 54 and smoothing by the loop filter 55. The information ψ satisfies the relationship of ψ>0 in the case of FIG. 13A, and satisfies the relationship of ψ<0 in the case of FIG. 13B.

Figure 14:
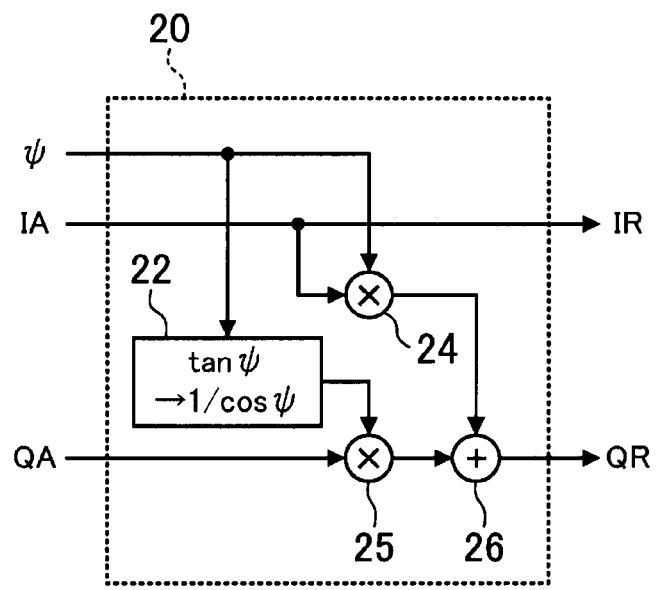
FIG. 14 is a block diagram illustrating an example configuration of an orthogonality corrector illustrated in FIG. 1.

FIG. 14 is a block diagram illustrating an example configuration of the orthogonality corrector 20 illustrated in FIG. 1. The orthogonality corrector 20 includes a conversion ROM 22, multipliers 24 and 25, and an adder 26. The orthogonality corrector 20 uses the orthogonality error information ψ (i.e., an error in orthogonality) from the orthogonality error detector 50 as tan ψ because the orthogonality error information ψ is small enough.

The conversion ROM 22 converts the orthogonality error information tan ψ into 1/cos ψ and outputs the obtained value of 1/cos ψ. The multiplier 25 multiplies a quadrature component QA by the value of 1/cos ψ from the conversion ROM 22, and outputs the obtained product to the adder 26. The multiplier 24 multiplies an in-phase component IA by the orthogonality error information tan ψ, and outputs the obtained product to the adder 26. The adder 26 adds the products obtained by the multipliers 24 and 25 together, and outputs a corrected quadrature component QR.

Next, operation of the orthogonality corrector 20 will be described in detail. Since the amplitudes of the in-phase component II and the quadrature component QI have been corrected by the amplitude corrector 10 at the previous stage, the in-phase component IA and the quadrature component QA after the amplitude correction have the same amplitudes. In view of this, the in-phase component IA and the quadrature component QA are expressed by Equations (7) and (8):

$$IA = A \cos\{(2\pi \times \Delta f \times t) + \phi + \theta(t)\} \quad (7)$$

$$QA = A \sin\{(2\pi \times \Delta f \times t) + \phi + \theta(t) + \psi\} \quad (8)$$

where Δf: frequency offset [Hz]
φ: phase offset [rad],
θ(t): phase information [rad],
ψ: orthogonality error information [rad],
t: time [sec], and
A: amplitudes of in-phase component and quadrature component In the case of correcting the orthogonality error information ψ of the quadrature component QA, the quadrature component QR after an orthogonality error correction is obtained by:

$$QR = IA \times \tan \psi + QA/\cos \psi \quad (9)$$

where the phase offset φ and the phase information θ are 0 (zero), and ω=2π×Δf, for convenience. Substituting Equations (7) and (8) in (9) yields:

$$QR = A \sin \omega t$$

In this manner, the orthogonality corrector 20 performs operation of Equation (9) using the in-phase component IA and the quadrature component QA as inputs, thereby correcting the orthogonality error information ψ of the quadrature component QA and outputting a corrected quadrature component QR.

As described above, the amplitude/orthogonality error compensator 100 illustrated in FIG. 1 can accurately correct an amplitude/orthogonality error in a case where a complex signal obtained through quadrature detection is a sine wave with a constant frequency. In addition, the amplitude/orthogonality error compensator 100 can be implemented in a small circuit scale, and an amplitude/orthogonality error correction can also be performed without a difference in signal power value between before and after the correction.

Figure 15:
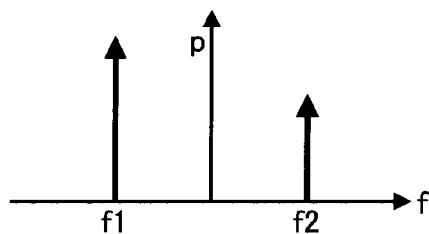
FIG. 15 shows an example spectrum of a signal for analog television broadcasting.

Now, it will be described how an output signal CR is improved by the presence of the filter section 30 in the amplitude/orthogonality error compensator 100 illustrated in FIG. 1. FIG. 15 shows an example spectrum of a signal for analog television broadcasting. This signal includes a video signal V1 with a frequency f1 and an audio signal A1 with a frequency f2. Here, it is assumed that the signal including the video signal V1 and the audio signal A1 is input to the amplitude/orthogonality error compensator 100 as an input signal CI.

Figure 16:
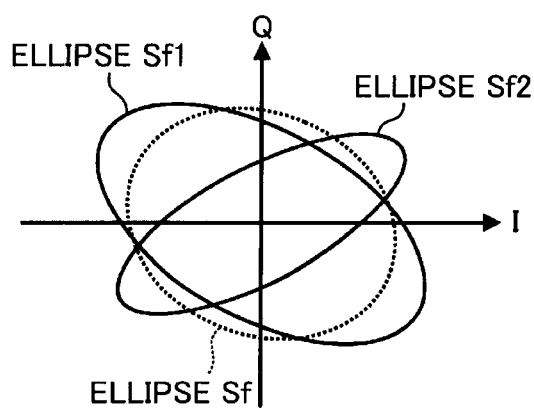
FIG. 16 shows, in a complex plane, example loci of vectors corresponding to components of an output signal CR from the amplitude/orthogonality error compensator illustrated in FIG. 1 on the assumption that the amplitude/orthogonality error compensator includes no filter section.

FIG. 16 shows, in a complex plane, example loci of vectors corresponding to components of the output signal CR of the amplitude/orthogonality error compensator 100 on the assumption that the amplitude/orthogonality error compensator 100 illustrated in FIG. 1 includes no filter section 30. For example, as shown by a curve G2 in FIG. 4 and a curve φ2 in FIG. 5, it is assumed that an amplitude error and an orthogonality error have occurred between an in-phase component and a quadrature component of the video signal V1 in FIG. 15. Similarly to the case of the video signal V1, an amplitude error and an orthogonality error have occurred between an in-phase component and a quadrature component of the audio signal A1. The amplitude error of the video signal V1 differs from the amplitude error of the audio signal A1, and the orthogonality error of the video signal V1 differs from the orthogonality error of the audio signal A1.

The loci of vectors corresponding to the video signal V1 and the audio signal A1 are respectively represented by ellipses Sf1 and Sf2 in FIG. 16. In this case, under the influence of both of the video signal V1 and the audio signal A1, the locus of a vector corresponding to the output signal CR is not a complete circle, but an ellipse Sf shown in FIG. 16.

Figure 17A:
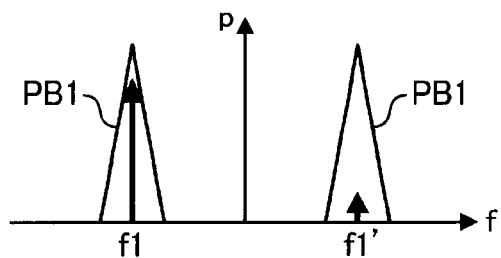
FIGS. 17A, 17B, and 17C are spectrum diagrams showing examples of a pass-band PB1 of a filter section illustrated in FIG. 1.

FIG. 17A is a spectrum diagram showing an example of a pass-band PB1 of the filter section 30 illustrated in FIG. 1. In FIG. 17A, the filter section 30 allows only signals having frequencies near the frequency f1 and signals having frequencies near an image frequency f1' of the frequency f1 to pass therethrough such that the video signal V1 passes through the filter section 30 and the audio signal A1 does not pass through the filter section 30. FIG. 17A shows that attenuation on a signal decreases as the position on the line indicating the pass-band PB1 becomes higher. The same holds for the drawings that will be referred to in the following description. The filter section 30 may have characteristics as shown in FIGS. 17B and 17C.

Figure 17B:
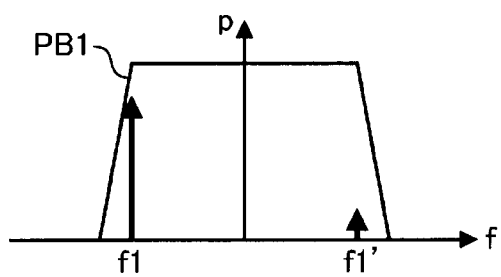

FIG. 17B is a spectrum diagram showing another example of the pass-band PB1 of the filter section 30 illustrated in FIG. 1. In the case of FIG. 17B, the filter section 30 is a low pass filter (LPF), and allows only signals whose frequencies are included in a band from the frequency f1 to the image frequency f1' to pass therethrough. FIG. 17C is a spectrum diagram showing yet another example of the pass-band PB1 of the filter section 30 illustrated in FIG. 1. In the case of FIG. 17C, the filter section 30 is a notch filter, and does not allow signals having frequencies near the frequency f2 to pass therethrough or significantly attenuates these signals. In this manner, the filter section 30 allows predetermined frequency components to pass therethrough, and significantly attenuates, or does not allow the passage of, the other frequency components.

Figure 17C:
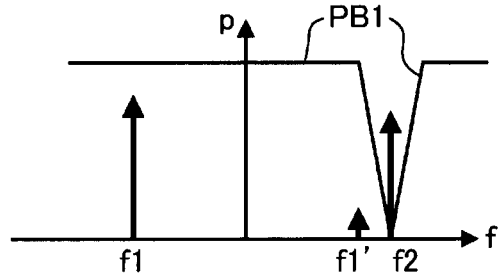
Figure 18:
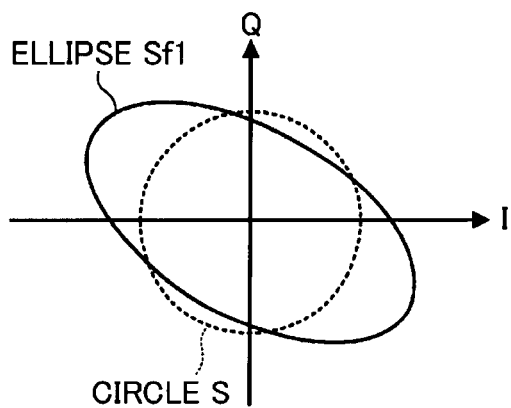
FIG. 18 shows, in a complex plane, an example locus of a vector corresponding to a signal that passes through a filter section in a case where the amplitude/orthogonality error compensator illustrated in FIG. 1 includes the filter section having characteristics shown in FIG. 17A, 17B, or 17C.

FIG. 18 shows, in a complex plane, an example locus of a vector corresponding to a signal that passes through the filter section 30 in a case where the amplitude/orthogonality error compensator 100 illustrated in FIG. 1 includes the filter section 30 having characteristics shown in FIG. 17A, 17B, or 17C. In this case, it is sufficient to correct only the amplitude and the orthogonality of the video signal V1, and thus, the locus of a vector corresponding to the output signal CR is represented by a circle S in FIG. 18.

Figure 19A:
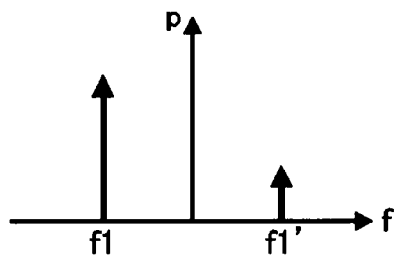
FIG. 19A shows an example spectrum of a video signal V1 corresponding to an ellipse Sf1 in FIG. 18.
Figure 19B:
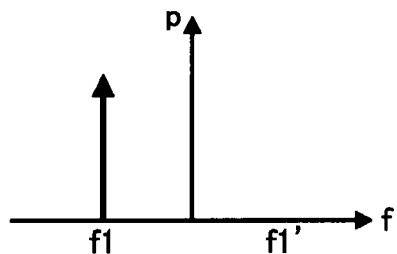
FIG. 19B shows an example spectrum of a signal corresponding to a circle S in FIG. 18 in an output signal CR.

FIG. 19A shows an example spectrum of the video signal V1 corresponding to the ellipse Sf1 in FIG. 18. As shown in FIG. 19A, in the case of the ellipse Sf1, the video signal V1 includes an image interference signal with a frequency f1'. FIG. 19B shows an example spectrum of a signal corresponding to the circle S in FIG. 18 in the output signal CR. In the output signal CR, the video signal V1 hardly includes an amplitude error and an orthogonality error, and thus, does not include an image interference signal with the frequency f1'. In other words, image suppression is performed. Since corrections of an amplitude error and an orthogonality error are not accurately performed for the audio signal A1, the output signal CR includes the audio signal A1 having an amplitude error and an orthogonality error.

Figure 20:
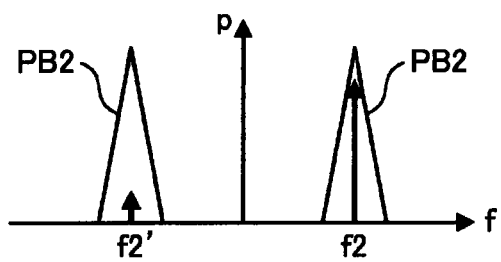
FIG. 20 is a spectrum diagram showing an example of another pass-band PB2 of the filter section illustrated in FIG. 1.

FIG. 20 is a spectrum diagram showing an example of another pass-band PB2 of the filter section 30 illustrated in FIG. 1. In FIG. 20, the filter section 30 allows only signals having frequencies near the frequency f2 and signals having frequencies near an image frequency f2' of the frequency f2 to pass therethrough such that the audio signal A1 passes through the filter section 30 and the video signal V1 does not passes through the filter section 30.

Figure 21:
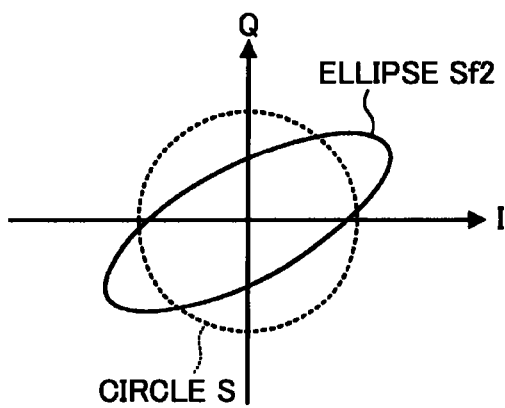
FIG. 21 shows, in a complex plane, an example locus of a vector corresponding to a signal that passes through a filter section in a case where the amplitude/orthogonality error compensator illustrated in FIG. 1 includes a filter section having characteristics shown in FIG. 20.

FIG. 21 shows, in a complex plane, an example locus of a vector corresponding to a signal that passes through the filter section 30 in a case where the amplitude/orthogonality error compensator 100 illustrated in FIG. 1 includes the filter section 30 having characteristics shown in FIG. 20. In this case, it is sufficient to correct only the amplitude and the orthogonality of the audio signal A1, and thus, the locus of a vector corresponding to the output signal CR is represented by a circle S in FIG. 21.

Figure 22A:
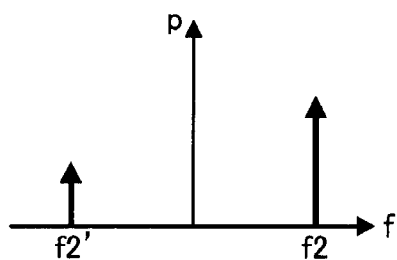
FIG. 22A shows an example spectrum of an audio signal A1 corresponding to an ellipse Sf2 in FIG. 21.
Figure 22B:
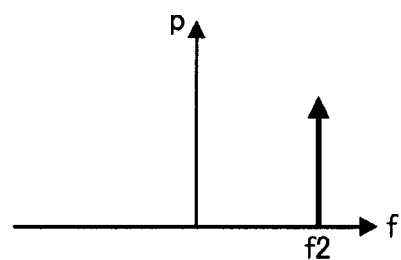
FIG. 22B shows an example spectrum of a signal corresponding to a circle S in FIG. 21 in an output signal CR.

FIG. 22A shows an example spectrum of the audio signal A1 corresponding to the ellipse Sf2 in FIG. 21. In this manner, the audio signal A1 includes an image interference signal having the frequency f2'. FIG. 22B shows an example spectrum of a signal corresponding to the circle S in FIG. 21 in the output signal CR. In the output signal CR, the audio signal A1 hardly includes an amplitude error and an orthogonality error, and thus, does not include an image interference signal with the frequency f2'. In other words, image suppression is performed.

The presence of the filter section 30 is advantageous especially when detection of an amplitude error and an orthogonality error needs to be focused on one signal among two or more signals having different frequencies. For example, in the case of inputting signals including a video signal and an audio signal having substantially the same power value, e.g., signals conforming to the national television system committee (NTSC) standard, the phase alternation by line (PAL) standard, or the sequential couleur a memoire (SECAM) standard, the detection is focused on one of the signals and the other signal(s) is/are removed, thereby reducing the amount of errors.

Figure 23A:
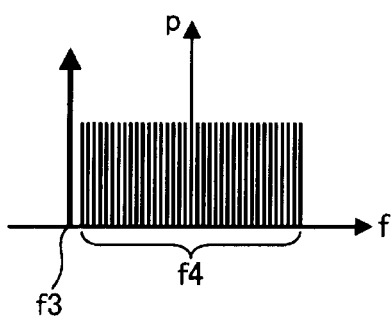
FIG. 23A shows an example spectrum of a signal including a wide-band signal.
Figure 23B:
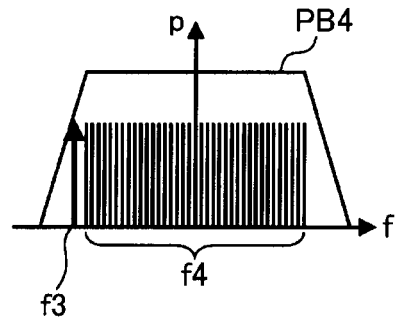
FIG. 23B shows an example of another pass-band PB4 of the filter section illustrated in FIG. 1 and an example spectrum of a signal that is illustrated in FIG. 23A and has passed through the filter section.

FIG. 23A shows an example spectrum of a signal including a wide-band signal. Here, it is assumed that a complex signal having a spectrum as shown in FIG. 23A is input to the amplitude/orthogonality error compensator 100 illustrated in FIG. 1. This signal includes a narrow-band signal F3 with a frequency f3 and a wide-band signal F4 with a frequency band f4. FIG. 23B shows an example of another pass-band PB4 of the filter section 30 illustrated in FIG. 1 and an example spectrum of a signal that is illustrated in FIG. 23A and has passed through the filter section 30. The filter section 30 has a frequency characteristic of attenuating the narrow-band signal F3 more greatly than the wide-band signal F4, and outputs the attenuated signal F3. That is, the pass-band PB4 is defined such that both of the narrow-band signal F3 and the wide-band signal F4 pass through the filter section 30 but the narrow-band signal F3 attenuates more greatly than the wide-band signal F4. Passage through the filter section 30 reduces the power value of the narrow-band signal F3.

Figure 24A:
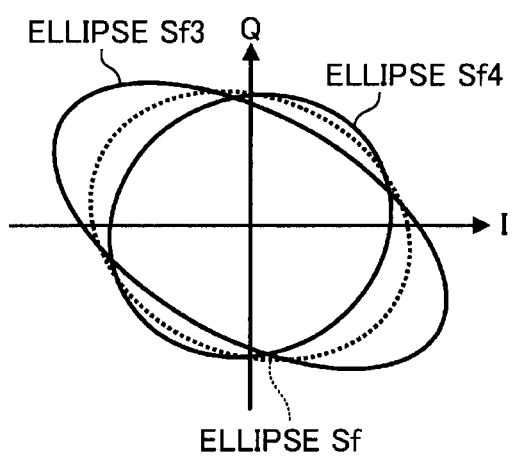
FIG. 24A shows, in a complex plane, other example loci of vectors corresponding to components of an output signal CR from the amplitude/orthogonality error compensator illustrated in FIG. 1 on the assumption that the amplitude/orthogonality error compensator includes no filter section.

FIG. 24A shows, in a complex plane, other example loci of vectors corresponding to components of the output signal CR from the amplitude/orthogonality error compensator 100 illustrated in FIG. 1 on the assumption that the amplitude/orthogonality error compensator 100 includes no filter section 30. It is assumed that an amplitude error and an orthogonality error have occurred between the in-phase component and the quadrature component of the narrow-band signal F3 in FIG. 23, and an amplitude error and an orthogonality error have also occurred between the in-phase component and the quadrature component of the wide-band signal F4. The loci of vectors corresponding to the narrow-band signal F3 and the wide-band signal F4 are respectively represented by ellipses Sf3 and Sf4 in FIG. 24A.

Since the narrow-band signal F3 has a large power, the ellipse f3 is also large. It is assumed that the ellipse Sf4 is closer to a complete circle than the ellipse Sf3 is. In this case, corrections of the narrow-band signal F3 and the wide-band signal F4 without any adjustment are greatly affected by the narrow-band signal F3, and thus, the ellipse Sf corresponding to the output signal CR is more greatly different from a circle than the ellipse Sf4 is. In view of this, the filter section 30 that attenuates the narrow-band signal F3 more greatly than the wide-band signal F4 and outputs the attenuated narrow-band signal F3, specifically the filter section 30 having the pass-band PB4 as illustrated in FIG. 23B, for example, is used. The use of such a filter section can reduce the power of the narrow-band signal F3 and reduce the influence of the narrow-band signal F3 on the corrections.

Figure 24B:
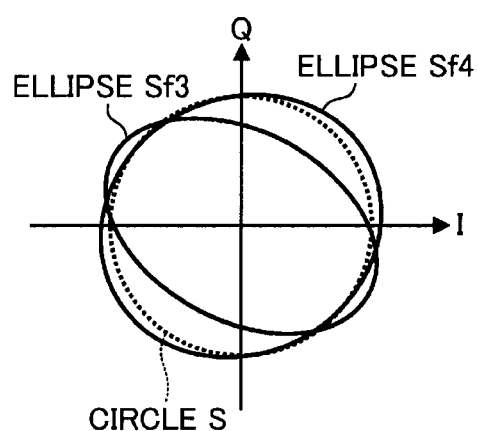
FIG. 24B shows, in a complex plane, example loci of vectors corresponding to signals that pass through the filter section in a case where the amplitude/orthogonality error compensator illustrated in FIG. 1 includes the filter section having characteristics shown in FIG. 23B.

FIG. 24B shows, in a complex plane, example loci of vectors corresponding to signals that pass through the filter section 30 in a case where the amplitude/orthogonality error compensator 100 illustrated in FIG. 1 includes the filter section 30 having characteristics shown in FIG. 23B. The ellipse f3 is smaller than that in FIG. 24A. In this case, an amplitude correction and an orthogonality correction on the narrow-band signal F3 and the wide-band signal F4 can make the ellipse Sf closer to the circle S. As a result, the accuracies of the amplitude correction and the orthogonality correction can be enhanced, thereby reducing generation of image components by the narrow-band signal F3.

A filter as described above is effective in a case where an input signal includes a narrow-band signal and a wide-band signal, both of which are necessary, and a correction is performed using the wide-band signal as a main signal. In an example case, a vestigial-sideband (VSB) signal, which includes a pilot signal as a narrow-band signal and a video signal and an audio signal as wide-band signals, is input.

Figure 25:
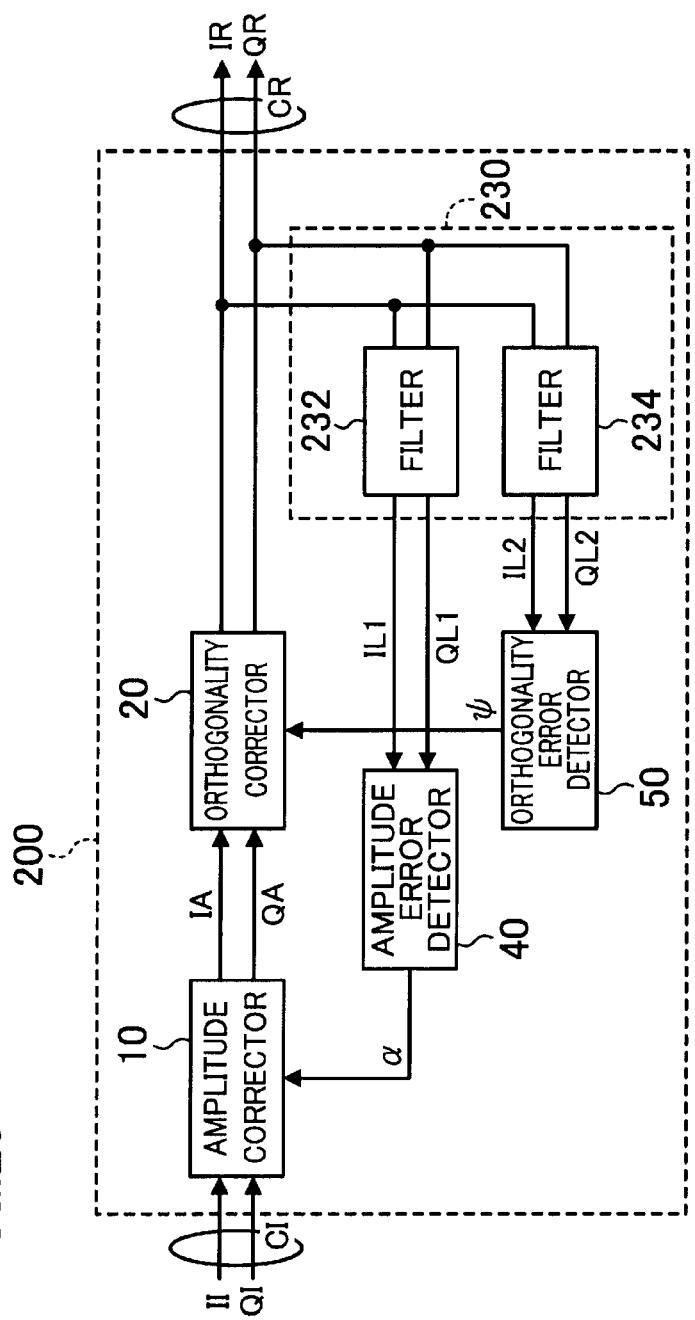
FIG. 25 a block diagram illustrating another example configuration of the amplitude/orthogonality error compensator illustrated in FIG. 1.

FIG. 25 is a block diagram illustrating another example configuration of the amplitude/orthogonality error compensator 100 illustrated in FIG. 1. An amplitude/orthogonality error compensator 200 illustrated in FIG. 25 includes a filter section 230, instead of the filter section 30. The filter section 230 includes filters 232 and 234. The filter 232 allows predetermined frequency components in an in-phase component IR and a quadrature component QR to pass therethrough, and outputs the components that have passed through the filter 232 as an in-phase component IL1 and a quadrature component QL1. The filter 234 allows predetermined frequency components different from components allowed to pass through the filter 232 among the in-phase component IR and the quadrature component QR to pass therethrough, and outputs the components that have passed through the filter 232 as an in-phase component IL2 and a quadrature component QL2. The amplitude error detector 40 determines in-phase amplitude error factors $\alpha$ based on the in-phase component IL1 and the quadrature component QL1, and outputs the determined factors $\alpha$ to the amplitude corrector 10. The orthogonality error detector 50 determines orthogonality error information $\psi$ for the in-phase component IL2 and the quadrature component QL2, and outputs the determined information $\psi$ to the orthogonality corrector 20. The other aspects are the same as those in the amplitude/orthogonality error compensator 100 illustrated in FIG. 1, and description thereof is not repeated.

The amplitude/orthogonality error compensator 200 can define the pass-band of the filter 232 and the pass-band of the filter 234 as bands with different widths, for example. In this manner, an amplitude correction and an orthogonality correction can be more appropriately performed.

Figure 26:
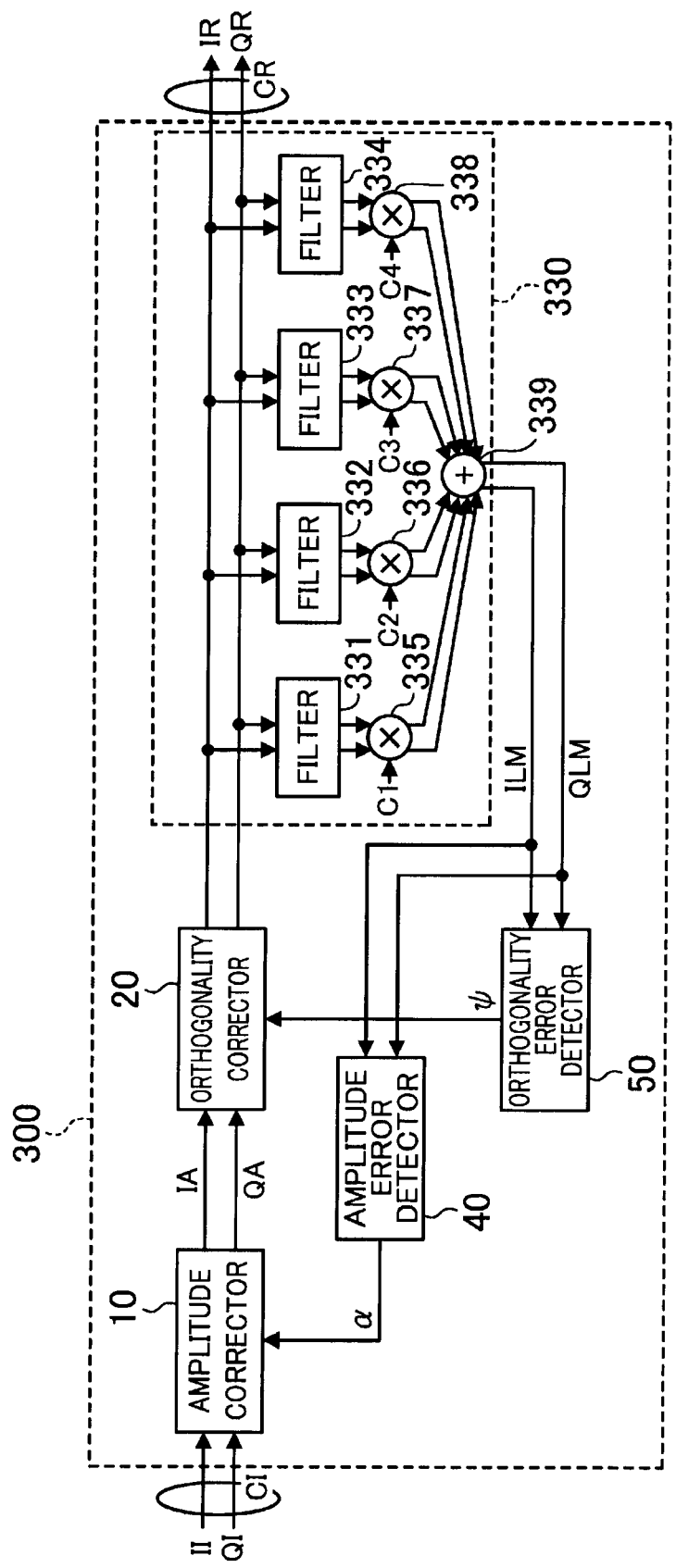
FIG. 26 is a block diagram illustrating still another example configuration of the amplitude/orthogonality error compensator illustrated in FIG. 1.

FIG. 26 is a block diagram illustrating still another example configuration of the amplitude/orthogonality error compensator 100 illustrated in FIG. 1. An amplitude/orthogonality error compensator 300 illustrated in FIG. 26 includes a filter section 330, instead of the filter section 30. The filter section 330 includes filters 331, 332, 333, and 334, multipliers 335, 336, 337, and 338, and an adder 339.

The filters 331-334 individually have predetermined pass-bands. The filters 331-334 individually allow predetermined frequency components of the in-phase component IR to pass therethrough, and output the components that have passed through the filters 331-334. Similarly, the filters 331-334 individually allow predetermined frequency components of the quadrature component QR to pass therethrough, and output the components that have passed through the filters 331-334.

The multiplier 335 multiplies the in-phase component from the filter 331 by a coefficient C1, multiplies the quadrature component from the filter 331 by the coefficient C1, and outputs the products. The multiplier 336 multiples the in-phase component from the filter 332 by a coefficient C2, multiplies the quadrature component from the filter 332 by the coefficient C2, and outputs the products. The multiplier 337 multiples the in-phase component from the filter 333 by a coefficient C3, multiples the quadrature component from the filter 333 by the coefficient C3, and outputs the products. The multiplier 338 multiples the in-phase component from the filter 334 by a coefficient C4, multiples the quadrature component from the filter 334 by the coefficient C4, and outputs the products. The adder 339 adds the products of the in-phase components from the multipliers 335-338 together, and outputs the sum as an in-phase component ILM. The adder 339 also adds the products of the quadrature components from the multipliers 335-338 together, and outputs the sum as a quadrature component QLM.

The amplitude error detector 40 determines an in-phase amplitude error factor α for the in-phase component ILM and the quadrature component QLM obtained by the adder 339, and outputs the determined factor α to the amplitude corrector 10. The orthogonality error detector 50 determines orthogonality error information ψ for the in-phase component ILM and the quadrature component QLM, and outputs the determined information ψ to the orthogonality corrector 20. The other aspects are the same as those in the amplitude/orthogonality error compensator 100 illustrated in FIG. 1, and description thereof is not repeated.

Figure 27A:
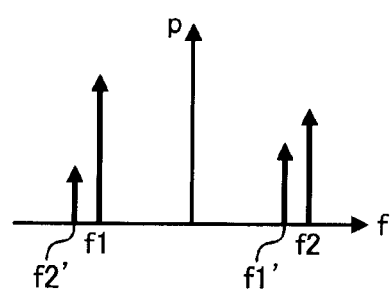
FIG. 27A shows other example spectra of signals for analog television broadcasting.

FIG. 27A shows other example spectra of signals for analog television broadcasting. These signals include a video signal V1 (with a frequency f1), an audio signal A1 (with a frequency f2), an image signal (with a frequency f1') of the video signal V1, and an image signal (with a frequency f2') of the audio signal A1. Here, it is assumed that an input signal CI including these signals is input to the amplitude/orthogonality error compensator 300. The image signal is generated in a quadrature detector at a stage previous to the amplitude/orthogonality error compensator 300.

Figure 27B:
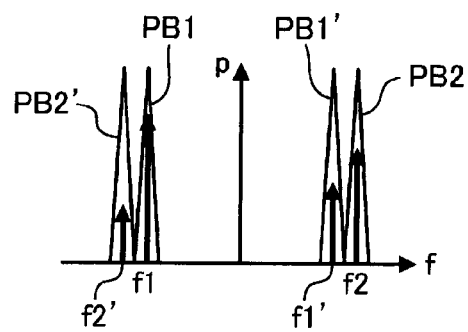
FIG. 27B shows example pass-bands of the filters illustrated in FIG. 26.

FIG. 27B shows example pass-bands of the filters 331-334 illustrated in FIG. 26. The filter 331 has a characteristic (pass-band PB2') of allowing only signals having frequencies near the frequency f2' to pass therethrough such that only the image signal of the audio signal A1 passes through the filter 331. The filter 332 has a characteristic (pass-band PB1) of allowing only signals having frequencies near the frequency f1 to pass therethrough such that only the video signal V1 passes through the filter 332. The filter 333 has a characteristic (pass-band PB1') of allowing only signals having frequencies near the frequency f1' to pass therethrough such that only the image signal of the video signal V1 passes through the filter 333. The filter 334 has a characteristic (pass-band PB2) of allowing only signals having frequencies near the frequency f2 to pass therethrough such that only the audio signal A1 passes through the filter 334.

The coefficient C2 corresponding to the video signal V1 and the coefficient C4 corresponding to the audio signal A1 are set positive, and the coefficient C1 corresponding to the image signal of the audio signal A1 and the coefficient C3 corresponding to the image signal of the video signal V1 are set negative. In this manner, an image signal can be removed or attenuated.

The values of the pass-bands of the filters 331-334 and the values of the coefficients C1-C4 can be set independently of each other. In a case where all the four signals having different bands are necessary, all the coefficients C1-C4 may be set positive. The foregoing description has been directed to the case where the filter section 330 includes four filters and four multipliers. Alternatively, the filter section 330 may include larger numbers of filters and multiplies.

In the foregoing description, the filter section 230, for example, allows predetermined frequency components to pass therethrough. Alternatively, the filter section 230, for example, may block the passage of predetermined frequency components.

Figure 28:
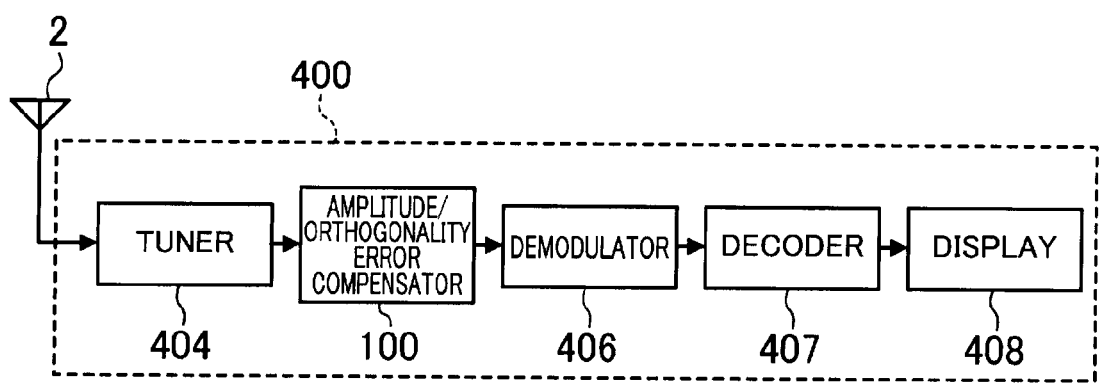
FIG. 28 is a block diagram illustrating an example configuration of a receiver including the amplitude/orthogonality error compensator illustrated in FIG. 1.

FIG. 28 is a block diagram illustrating an example configuration of a receiver 400 including the amplitude/orthogonality error compensator 100 illustrated in FIG. 1. The receiver 400 includes a tuner 404, the amplitude/orthogonality error compensator 100, a demodulator 406, a decoder 407, and a display 408.

The tuner 404 selects a necessary signal from signals received at an antenna 2, performs quadrature detection on the selected signal, and outputs the resulting signal to the amplitude/orthogonality error compensator 100. The demodulator 406 performs demodulation on the signal from the amplitude/orthogonality error compensator 100, and outputs the resulting signal. The decoder 407 performs a decoding process such as video image decoding on the signal demodulated by the demodulator 406, and outputs the resulting signal. The display 408 displays a video image represented by the decoded signal.

The receiver 400 may include the amplitude/orthogonality error compensator 200 or 300, instead of the amplitude/orthogonality error compensator 100. The amplitude/orthogonality error compensator 100, for example, may be included in the tuner 404 or the demodulator 406.

Each functional block herein can be typically implemented as hardware. For example, each functional block may be implemented on a semiconductor substrate as a part of an integrated circuit (IC). Here, an IC includes a large-scale integrated circuit (LSI), an application-specific integrated circuit (ASIC), a gate array, a field programmable gate array (FPGA), etc. Alternatively, a part or the entire part of each functional block may be implemented as software. For example, such a functional block may be implemented by a program that can be executed on a processor. In other words, each functional block herein may be implemented as hardware, software, or any combination of hardware and software.

The many features and advantages of the present disclosure are apparent from the detailed specification and, thus, it is intended by the appended claims to cover all such features and advantages of the present disclosure which fall within the true spirit and scope of the invention. Further, since numerous modifications and changes will readily occur to those skilled in the art, it is not desired to limit the present disclosure to the exact construction and operation illustrated and described, and accordingly all suitable modifications and equivalents may be resorted to, falling within the scope of the invention.

As described above, according to an embodiment of the present disclosure, even in a case where a plurality of signals having different frequencies are included in an input signal, an amplitude correction and an orthogonality correction can be performed more accurately. Thus, the present disclosure is useful for amplitude/orthogonality error compensators, for example.

What is claimed is:

1. An amplitude/orthogonality error compensator comprising:
    an amplitude corrector configured to perform an amplitude correction on an in-phase component and a quadrature component of an input complex signal based on amplitude error information, and to output a complex signal obtained through the amplitude correction;
    an orthogonality corrector configured to perform an orthogonality correction on the complex signal, obtained through the amplitude correction, based on orthogonality error information, and to output a complex signal obtained through the orthogonality correction;
    a filter section configured to allow a predetermined frequency component included in the complex signal obtained through the orthogonality correction to pass through the filter section;
    an amplitude error detector configured to determine the amplitude error information based on an in-phase component and a quadrature component of the complex signal that has passed through the filter section; and an orthogonality error detector configured to determine the orthogonality error information indicating an orthogonality error between the in-phase component and the quadrature component of the complex signal that has passed through the filter section.

2. The amplitude/orthogonality error compensator of claim 1, wherein in a case where the input complex signal includes a narrow-band signal and a wide-band signal, the filter section attenuates the narrow-band signal more greatly than the wide-band signal.

3. The amplitude/orthogonality error compensator of claim 1, wherein the filter section includes:

a first filter configured to allow a predetermined first frequency component included in the complex signal obtained through the orthogonality correction to pass through the first filter; and a second filter configured to allow a predetermined second frequency component included in the complex signal obtained through the orthogonality correction to pass through the second filter, the amplitude error detector determines the amplitude error information based on an in-phase component and a quadrature component of the complex signal that has passed through the first filter, and the orthogonality error detector determines the orthogonality error information indicating an orthogonality error between an in-phase component and a quadrature component of the complex signal that has passed through the second filter.

4. The amplitude/orthogonality error compensator of claim 1, wherein the filter section includes:

a plurality of filters each configured to output a predetermined frequency component included in the complex signal obtained through the orthogonality correction;

a plurality of multipliers respectively associated with the filters and each configured to multiply a signal output from an associated one of the filters by a predetermined coefficient to obtain and output a product; and an adder configured to add the products from the multipliers and to output a sum of the products.

* * * * *